(12) United States Patent
Hasegawa et al.

(10) Patent No.: US 8,188,500 B2
(45) Date of Patent: May 29, 2012

(54) ORGANIC LIGHT-EMITTING ELEMENT AND LIGHT-EMITTING DEVICE USING THE SAME

(75) Inventors: Toshinori Hasegawa, Yokohama (JP); Naoto Nakamura, Mobara (JP); Masato Yajima, Tokyo (JP); Ryota Watanabe, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 49 days.

(21) Appl. No.: 12/638,766

(22) Filed: Dec. 15, 2009

(65) Prior Publication Data

US 2010/0155711 A1 Jun. 24, 2010

(30) Foreign Application Priority Data

Dec. 19, 2008 (JP) ................................. 2008-324479

(51) Int. Cl.
*H01L 33/10* (2010.01)
*H01L 33/26* (2010.01)
*H01L 33/42* (2010.01)
(52) U.S. Cl. ........... 257/98; 257/E51.019; 257/E33.044; 438/29; 313/503; 313/506
(58) Field of Classification Search ............ 257/98, 257/E51.019, E33.044; 438/29; 313/503, 313/506
See application file for complete search history.

(56) References Cited

U.S. PATENT DOCUMENTS

| 5,847,506 | A | 12/1998 | Nakayama et al. |
| 2003/0034938 | A1 | 2/2003 | Yamada |
| 2003/0075714 | A1 | 4/2003 | Fukuoka et al. |
| 2004/0145303 | A1 | 7/2004 | Yamada |
| 2005/0227385 | A1 | 10/2005 | Tan |
| 2007/0170852 | A1 | 7/2007 | Yamada |
| 2007/0252520 | A1 | 11/2007 | Hasegawa |
| 2008/0203908 | A1 | 8/2008 | Hasegawa et al. |
| 2008/0309232 | A1* | 12/2008 | Yamamoto .................... 313/505 |
| 2009/0212692 | A1* | 8/2009 | Hasegawa ..................... 313/504 |

FOREIGN PATENT DOCUMENTS

JP 08-213174 A 8/1996

(Continued)

OTHER PUBLICATIONS

Japanese Office Action, "Notifications of Reasons for Refusal", dated Aug. 23, 2011, Japanese patent application No. 2009-270100.

(Continued)

*Primary Examiner* — David Vu
*Assistant Examiner* — Earl Taylor
(74) *Attorney, Agent, or Firm* — Canon U.S.A., Inc., IP Division

(57) ABSTRACT

An organic light-emitting element includes a first electrode, a second electrode, and at least one organic compound layer disposed between the first electrode and the second electrode. The organic compound layer includes a light-emitting layer containing a light-emitting material and being configured to emit light toward the first electrode and the second electrode. The light emitted toward the first electrode is reflected from a reflection plane located at the first electrode to cause interference with the light emitted toward the second electrode. The interference provides an interference intensity distribution having a maximum peak at a wavelength $\lambda_1$. The light-emitting material of the light-emitting layer exhibits a photoluminescence spectrum having a maximum peak at a wavelength $\lambda_2$. The organic light-emitting element produces an electroluminescence spectrum having a maximum peak at a wavelength $\lambda_3$. These wavelengths satisfy the relationships: $\lambda_2 \neq \lambda_3$ and $|\lambda_2-\lambda_3|<|\lambda_2-\lambda_1|$.

16 Claims, 4 Drawing Sheets

FOREIGN PATENT DOCUMENTS

| | | |
|---|---|---|
| JP | 2002-367770 A | 12/2002 |
| JP | 2004-127795 A | 4/2004 |
| JP | 2004-247137 A | 9/2004 |
| JP | 2005-322612 A | 11/2005 |
| JP | 2007-316611 A | 12/2007 |
| JP | 2008-210665 A | 9/2008 |
| WO | WO00/60905 A1 | 10/2000 |

OTHER PUBLICATIONS

Japanese Office Action for Japanese Patent Application No. 2009-270100, Dispatch date of Dec. 13, 2011, Reference No. 0079463-01, 6 pgs.

* cited by examiner

ORGANIC LIGHT-EMITTING ELEMENT AND LIGHT-EMITTING DEVICE USING THE SAME

BACKGROUND OF THE INVENTION

1. Field of the Invention

The present invention relates to a light-emitting element including an organic compound layer, and more specifically to an organic light-emitting element including at least one organic compound layer that is disposed between a pair of electrodes and includes a light-emitting layer emitting light by applying a current to the organic compound layer. The present invention also relates to a light-emitting device including the organic light-emitting element.

2. Description of the Related Art

Organic light-emitting elements (hereinafter simply referred to as elements in some cases) have recently been studied and developed intensively. Such an organic light-emitting element includes a pair of electrodes acting as an anode and a cathode, and at least one organic compound layers including a light-emitting layer between the pair of electrodes. Each organic compound layer has a thickness of several tens of nanometers. One of the pair of electrodes reflects light. The other electrode acts as a light extraction electrode. Light is partially reflected from the interface between the light extraction electrode and the external environment. Consequently, an optical interference effect occurs inside the organic light-emitting element to enhance the intensity of light having a specific wavelength.

Japanese Patent Laid-Open No. 2004-127795 discloses that optical interference can enhance the light extraction efficiency at a wavelength equal to the maximum peak wavelength of a spectrum desired to be extracted. FIG. 1 is a schematic sectional view of an organic light-emitting element disclosed in Japanese Patent Laid-Open No. 2004-127795. The organic light-emitting element shown in FIG. 1 includes a first electrode (anode) 11 doubling as a reflection layer, organic compound layers (including a hole injection layer 12, a hole transport layer 13, a light-emitting layer 14 and an electron transport layer 15) and a second electrode (anode) 16 made of a metal, in that order, on a substrate 10. Holes injected from the anode and electrons injected from the cathode are recombined in the light-emitting layer 14 by applying a current to the organic light-emitting element. The energy generated by the recombination excites the light-emitting material in the light-emitting layer, and when the light-emitting material returns to the ground state, the energy is emitted as light. Thus, the organic light-emitting element emits light.

This organic light-emitting element has a resonator structure on the substrate between the interface of the first electrode 11 and the hole injection layer 12 and the interface of the electron transport layer 15 and the second electrode 16. Let L be the optical length between the first electrode 11 and the second electrode 16, and let θ be the angle at which light from the element is viewed (when viewed at an angle perpendicular to the element, θ is 0°). Also, let φ (rad) be the sum of phase shifts of lights reflected from the interface between the first electrode 11 and the hole injection layer 12 and from the interface between the electron transport layer 15 and the second electrode 16, and let m be the order of optical interference. In this instance, the light having a wavelength λ (resonant wavelength) satisfying Formula 1 of the lights emitted from the light-emitting layer 14 can be intensified by the resonator structure.

$$\lambda = 2L \cdot \cos\theta/(m - \phi/2\pi) \text{ (}m\text{: natural number)} \quad \text{Formula 1}$$

When emitted light is reflected from a reflection layer or an electrode in practice, however, the sum φ of the phase shifts is varied depending on the combination of the materials of the electrode and organic layer defining the reflection plane.

In Japanese Patent Laid-Open No. 2004-127795, the optical length of the resonator structure is set so that the resonator structure can intensify light at the maximum peak wavelength of a desired spectrum to be extracted from the element, in consideration of the position in the light-emitting layer 14 at which light can be most strongly emitted. By appropriately setting the maximum peak wavelength of a desired spectrum and the resonant wavelength, the intensity at the maximum peak wavelength of the desired spectrum can be increased.

It is preferable that the photoluminescence spectrum (PL spectrum) of the light-emitting material used in the above-described type of light-emitting element coincide with the spectrum of the desired color to be extracted from the element. This is because the resonant wavelength is set to a wavelength different from the maximum peak wavelength of the PL spectrum. If the PL spectrum is different from the spectrum of the desired color to be extracted, luminous efficiency may not be obtained sufficiently. However, light emitting materials are very rare which have PL spectra substantially the same as the spectrum of a desired color to be extracted from the element. Even such materials do not always satisfy properties other than emission color, such as lifetime and luminous efficiency.

SUMMARY OF THE INVENTION

Accordingly, one aspect of the present invention provides an organic light-emitting element that can be produced using a variety of light-emitting materials and can exhibit a favorable emission color with a high luminous efficiency.

According to an aspect of the invention, an organic light-emitting element is provided which includes a first electrode, a second electrode, and at least one organic compound layer disposed between the first electrode and the second electrode. The organic compound layer includes a light-emitting layer containing a light-emitting material and being configured to emit light toward the first electrode and the second electrode. The light emitted toward the first electrode is reflected from a reflection plane located at the first electrode to cause interference with the light emitted toward the second electrode. The interference provides an interference intensity distribution having a maximum peak at a wavelength $\lambda_1$. The light-emitting material of the light-emitting layer exhibits a photoluminescence spectrum (PL spectrum) having a maximum peak at a wavelength $\lambda_2$. The organic light-emitting element produces an electroluminescence spectrum (EL spectrum) having a maximum peak at a wavelength $\lambda_3$. The wavelengths satisfy the relationships: $\lambda_2 \neq \lambda_3$ and $|\lambda_2-\lambda_3|<|\lambda_2-\lambda_1|$.

In the organic light-emitting element according to an embodiment of the present invention, the maximum peak wavelength $\lambda_1$ of the interference intensity distribution is shifted from the maximum peak wavelength $\lambda_2$ of the PL spectrum of the light-emitting material to expand the interference intensity distribution. Consequently, the emission color can be controlled. This allows use of a variety of light-emitting materials, and the resulting organic light-emitting element can emit a favorable color.

Further features of the present invention will become apparent from the following description of exemplary embodiments with reference to the attached drawings.

DESCRIPTION OF THE EMBODIMENTS

Figure 1:
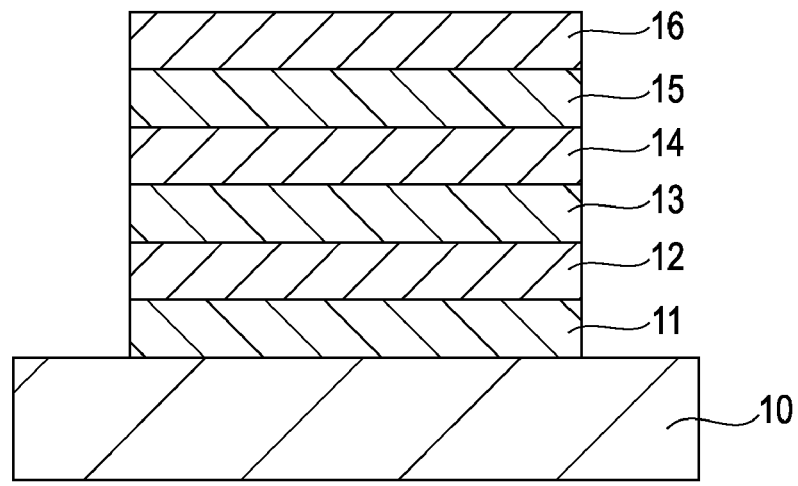
FIG. 1 is a schematic sectional view of a known organic light-emitting element.

The organic light emitting element according to aspects of the present invention will now be described in detail with reference to the drawings. Parts of the organic light-emitting element not shown in the drawings or not described in the following description are based on techniques known in the art.

Figure 2:
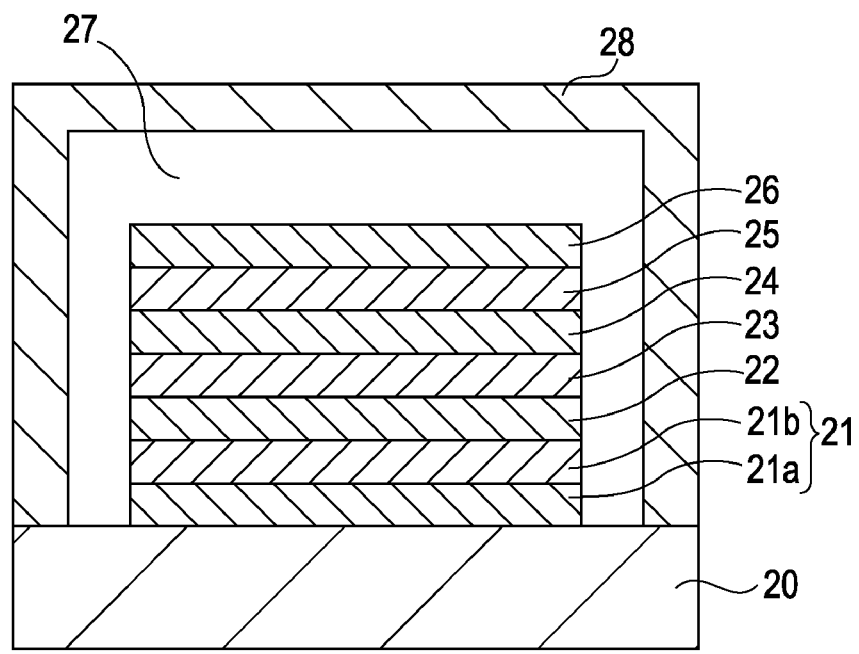
FIG. 2 is a schematic sectional view of an organic light-emitting element according to a first embodiment of the present invention.

FIG. 2 is a schematic sectional view of a top emission organic light-emitting element according to a first embodiment of the invention. In FIG. 2, the organic light-emitting element includes a first electrode 21 on a substrate 20. The first electrode 21 includes a reflection layer 21a and a transparent electroconductive layer 21b. Organic compound layers are disposed on the first electrode 21, including a hole transport layer 22, a light-emitting layer 23, an electron transport layer 24 and an electron injection layer 25, and a second electrode 26 is disposed on the organic compound layers. Although the first electrode 21 has a multilayer structure including the reflection layer 21a and the transparent electroconductive layer 21b in an embodiment, it may be defined by a single electroconductive layer made of a metal having a high reflectance. Reference numeral 27 denotes a seal space filled with dry nitrogen, and reference numeral 28 denotes a sealing member.

By applying a current between the first electrode 21 used as an anode and the second electrode 26 used as a cathode, holes injected to the hole transport layer 22 from the first electrode 21 and electrons to the electron injection layer 25 from the second electrode are transferred to the light-emitting layer 23 and recombined there. The energy generated by the recombination excites the light-emitting material in the light-emitting layer, and when the light-emitting material returns to the ground state, the energy is emitted as light. Thus, the organic light-emitting element emits light. Light thus emitted outgoes from the second electrode 26. In this instance, the second electrode 26 is transparent or translucent so as to have optical transparency. The optical transparency of a material means that the material has a transmittance in the range of 50% to 100% at wavelengths of visible light ($\lambda$=380 to 780 nm).

The substrate 20 of the organic light-emitting element in an embodiment of the present invention is not particularly limited and may be made of a metal, ceramic, glass or quartz. A flexible sheet, such as a plastic sheet, may be used as the substrate for a flexible light-emitting element.

The material of the reflection layer 21a is such that the reflectance at wavelengths of visible light is at least 50%, preferably 80% or more, at the interface with the transparent electroconductive layer 21b. Materials satisfying such a requirement include, for example, metals, such as aluminum, silver and chromium, and their alloys. The reflection layer 21a is not necessarily made of an electroconductive material, such as a metal, and an insulating member, such as a dielectric multilayer mirror, may be used as the reflection layer.

The transparent electroconductive layer 21a may comprise a metal oxide electroconductive film, such as a composite film of indium oxide and tin oxide (hereinafter referred to as ITO) or a composite film of indium oxide and zinc oxide. "Transparent" used herein means that visible light can be transmitted at a transmittance in the range of 70% to 100%. From the viewpoint of preventing the transparent electroconductive layer 21b from attenuate light emitted from the light-emitting layer 23, the transparent electroconductive layer has an extinction coefficient K of 0.05 or less, preferably 0.01 or less.

Organic compounds used for the hole transport layer 22, the light-emitting layer 23, the electron transport layer 24 and the electron injection layer 25 may be low-molecular-weight compounds, polymer materials or both, and can be selected without particular limitation. Known materials can be used as required.

The organic compound layer may have a single layer structure (light-emitting layer), a double layer structure (hole transport layer/light-emitting layer), a three-layer structure (hole transport layer/light-emitting layer/electron transport layer), a four-layer structure (hole injection layer/hole transport layer/light-emitting layer/electron injection layer), or a five-layer structure (hole injection layer/hole transport layer/light-emitting layer/electron transport layer/electron injection layer). The number and the order of organic compound layers are appropriately determined according to the electrode structure.

These organic compound layers are generally formed by vacuum vapor deposition, ionized vapor deposition, sputtering or plasma CVD, or coating of a solution of the material (spin coating, dipping, cast method, ink jet method, etc).

The electron injection layer 25 may be made of a conventionally used electron injection material, such as lithium fluoride, an alkali metal or an alkaline-earth metal. Alternatively, the electron injection layer 25 may be made of an electron-transporting organic compound containing an alkali metal or an alkaline-earth metal in an amount of 0.1% to several tens of percent. The electron injection layer 25 can be formed to a thickness of about 10 to 100 nm to reduce the damage from the formation of the second electrode 26 performed in a subsequent step.

Since light emitted from the light-emitting layer 23 is extracted through the second electrode 26, the second electrode 26 needs to have an optical transparency. Accordingly, the second electrode 26 can comprise the same metal oxide electroconductive film as the transparent electroconductive layer 21b, or a metal thin film, such as of silver. However, any material can be used for the second electrode as long as it has an optical transparency. If a metal oxide electroconductive film is used, the thickness of the film can be in the range of 10 to 1000 nm, preferably in the range of 30 to 300 nm, in view of the sheet resistance of the electrode and transmittance. If a metal thin film is used for the second electrode 26, the thickness of the metal thin film can be in the range of 5 to 30 nm, preferably in the range of 5 to 20 nm, in view of transmittance. The second electrode 26 may include two layers of a metal oxide electroconductive film and a metal thin film. The second electrode 26 can be formed by a known method, such as sputtering.

The sealing member 28 is provided to protect the element from oxygen and moisture of the external environment, and may be made of glass, a film impermeable to gases, or a metal. In order to enhance the moisture resistance, the seal space 27 may contain a hygroscopic material (not shown).

Instead of filling the seal space 27 between the sealing member 28 and the organic light-emitting element with dry nitrogen, a protective film may be formed directly on the element. The protective film may comprise a single layer film or a multilayer film of metal nitrides such as silicon nitride and silicon oxynitride, metal oxides such as tantalum oxide, diamond, and resins. The use of a protective film can advantageously achieve a thinner organic light-emitting element, and is particularly preferred.

The layers constituting the organic light-emitting element generally have thicknesses of about several tens of nanometers, and the optical length of each layer being a product (nd) of the thickness (d) and the refractive index (n) corresponds to a fraction of wavelengths (λ=350 to 780 nm) of visible light. Consequently, multiple reflection and interference of visible light occur notably in the organic light-emitting element.

The wavelength λ of light intensified by this interference is determined depending on the structural parameters of the organic light-emitting element, such as optical length L and sum φ of phase shifts of light reflected from interfaces between layers, and the order m of optical interference, according to Formula 1.

When one of the two materials defining an interface is medium I, the other is medium II, and their respective optical constants are $(n_1, k_1)$ and $(n_2, k_2)$, the phase shift φ at the interface is expressed by Formula 2. These optical constants can be measured with, for example, a spectroscopic ellipsometer.

$$\phi = \tan^{-1}(2n_1 k_2 / (n_1^2 - n_2^2 - k_2^2)) \quad \text{Formula 2}$$

In the organic light-emitting element of an embodiment of the present invention, each interface between the layers acts as a reflection plane from which light emitted from the light-emitting layer 23 is reflected because the layers have different optical constants. Accordingly, lights reflected from the interfaces have different intensities and phases. These reflected lights cause multiple interference, and this multiple interference determines the interference intensity distribution.

In the organic light-emitting element shown in FIG. 2, the interference intensity distribution is significantly subject to the interference between the light running from the light-emitting layer 23 to the first electrode 21 and reflecting from the interface between the reflection layer 21a and the transparent electroconductive layer 21b and the light running from the light-emitting layer 23 to the second electrode 26. Hence, the "reflection plane located at the first electrode" in the structure shown in FIG. 2 refers to the interface between the reflection layer 21a and the transparent electroconductive layer 21b. If the first electrode 21 is composed of only a metal layer having a high reflectance, the interface between the metal layer and the hole transport layer 22 is the "reflection plane located at the first electrode". If the first electrode 21 does not include a reflection layer or a metal layer having a high reflectance, the "reflection plane located at the first electrode" is defined by the interface having the largest difference in refractive index in the first electrode 21, or the interface between the first electrode 21 and the hole transport layer 22.

The interference intensity distribution of the organic light-emitting element can be obtained by, for example, general property matrix calculation using the thickness and optical constants of each layer of the element as parameters. The optical constants of each organic compound layer depend on the material.

Figure 3:
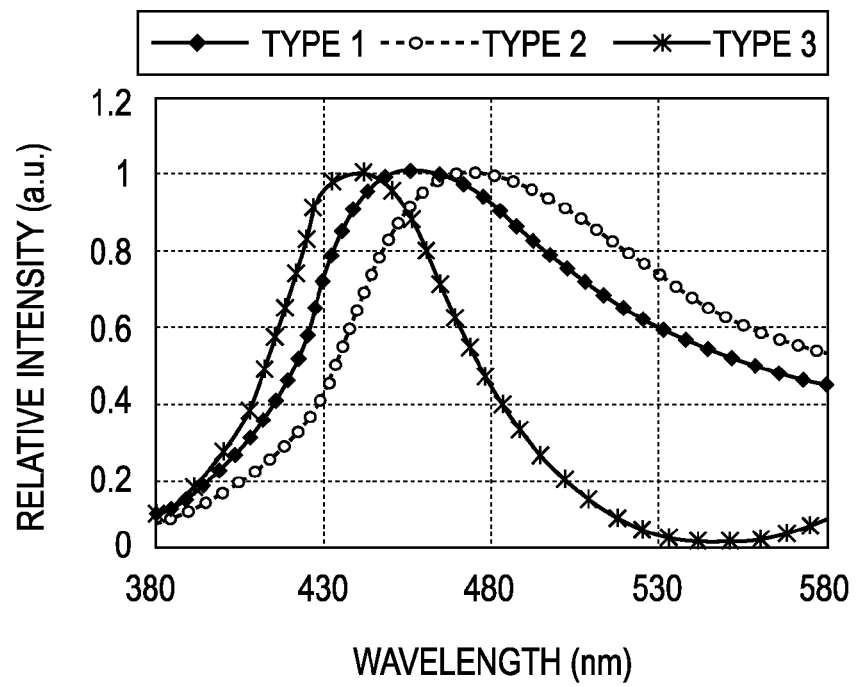
FIG. 3 is a plot of the interference intensity distribution of organic light-emitting elements: Type 1, Type 2 and Type 3.

FIG. 3 shows the interference intensity distributions of three organic light-emitting elements according to an embodiment of the present invention. In the three elements, the thicknesses of the transparent electroconductive layers 21b and the hole transport layers 22 are varied. In FIG. 3, the intensity in the interference intensity distributions of each element is represented by a relative value to the intensity at a wavelength at which light can be most intensified. Table 1 shows the thicknesses of each layer of the three elements, and Table 2 shows the optical constants of the layers. Table 3 shows the maximum peak wavelength and the half-width of the interference intensity distribution of each element. The half-width of an interference intensity distribution (or PL spectrum) refers to the width between the minimum wavelength and the maximum wavelength at which the intensity is half of the maximum intensity in the interference intensity distribution (or PL spectrum).

TABLE 1

|  | Type 1 (nm) | Type 2 (nm) | Type 3 (nm) |
| --- | --- | --- | --- |
| Reflection layer | 150 | 150 | 150 |
| Transparent electroconductive layer | 10 | 10 | 100 |
| Hole transport layer | 30 | 40 | 52 |
| Light-emitting layer | 35 | 35 | 35 |
| Electron transport layer | 20 | 20 | 20 |
| Electron injection layer | 65 | 65 | 65 |
| Second electrode | 20 | 20 | 20 |

TABLE 2

|  |  | Wavelength | | | | | | | |
| --- | --- | --- | --- | --- | --- | --- | --- | --- | --- |
|  |  | 400 nm | 450 nm | 500 nm | 550 nm | 600 nm | 650 nm | 700 nm | 750 nm |
| Reflection layer | n | 0.55 | 0.68 | 0.82 | 0.97 | 1.14 | 1.31 | 1.49 | 1.68 |
|  | k | 3.67 | 4.15 | 4.61 | 5.06 | 5.50 | 5.93 | 6.34 | 6.74 |
| Transparent electroconductive layer | n | 2.00 | 1.92 | 1.85 | 1.79 | 1.72 | 1.66 | 1.59 | 1.53 |
|  | k | 0.03 | 0.02 | 0.01 | 0.01 | 0.01 | 0.01 | 0.00 | 0.00 |
| Hole transport layer | n | 2.38 | 1.91 | 1.82 | 1.77 | 1.74 | 1.72 | 1.71 | 1.70 |
|  | k | 0.10 | 0.00 | 0.00 | 0.00 | 0.00 | 0.00 | 0.00 | 0.00 |
| Light-emitting layer | n | 2.31 | 1.96 | 1.84 | 1.79 | 1.77 | 1.76 | 1.76 | 1.75 |
|  | k | 0.17 | 0.00 | 0.00 | 0.00 | 0.00 | 0.00 | 0.00 | 0.00 |
| Electron transport layer | n | 2.06 | 1.83 | 1.77 | 1.74 | 1.72 | 1.71 | 1.70 | 1.69 |
|  | k | 0.00 | 0.00 | 0.00 | 0.00 | 0.00 | 0.00 | 0.00 | 0.00 |
| Electron injection layer | n | 1.93 | 1.81 | 1.80 | 1.79 | 1.78 | 1.77 | 1.76 | 1.75 |
|  | k | 0.08 | 0.07 | 0.07 | 0.05 | 0.04 | 0.03 | 0.03 | 0.02 |
| Second electrode | n | 2.19 | 2.08 | 2.00 | 1.94 | 1.89 | 1.86 | 1.83 | 1.81 |
|  | k | 0.06 | 0.01 | 0.00 | 0.00 | 0.00 | 0.00 | 0.00 | 0.00 |

TABLE 3

|  | Type 1 | Type 2 | Type 3 |
|---|---|---|---|
| Maximum peak wavelength (nm) | 460 | 475 | 440 |
| Half-width (nm) | 135 | 160 | 65 |

FIG. 3 and Tables 1 and 3 show that the maximum peak wavelength and the half-width in the interference intensity distribution of the organic light-emitting element can be controlled by varying the thicknesses of the transparent electroconductive layer 21b and the hole transport layer 22. Although the present embodiment shows that the interference intensity distribution can be controlled by varying the thicknesses of the transparent electroconductive layer 21b and the hole transport layer 22, the interference intensity distribution can be controlled by the thicknesses of other layers of the element. The interference intensity distribution can also be controlled by changing the materials of some layers of the element to vary the optical constants.

It will now be described that the light emitting characteristics of the organic light-emitting element are controlled using the interference intensity distribution. The light-emitting layer 23 of the organic light-emitting element according to the present embodiment contains a light-emitting material exhibiting the PL spectrum shown in FIG. 4 having a maximum peak at a wavelength of 475 nm and a half-width of 46 nm. This PL spectrum is perceived as blue light. Table 4 shows the luminescent chromaticities of the organic light-emitting elements Types 1 to 3 shown in Table 1, each including a light-emitting layer 23 containing such a light-emitting material.

TABLE 4

|  | Type 1 | Type 2 | Type 3 |
|---|---|---|---|
| Maximum peak wavelength of EL spectrum (nm) | 470 | 475 | 460 |
| Luminescent chromaticity CIEx | 0.111 | 0.104 | 0.125 |
| Luminescent chromaticity CIEy | 0.135 | 0.165 | 0.080 |
| Relative extraction efficiency | 1.00 | 1.13 | 0.40 |

As shown in Table 4, organic light-emitting elements including layers having different thicknesses from one element to another, that is, organic light-emitting elements having different interference intensity distributions, have different light emitting characteristics (maximum peak wavelength $\lambda_3$ of electroluminescence spectrum (EL spectrum), luminescent chromaticity, relative extraction efficiency to the extraction efficiency of Type 1). The EL spectrum extracted from an element is that of light viewed at an angle perpendicular to the element.

Figure 5:
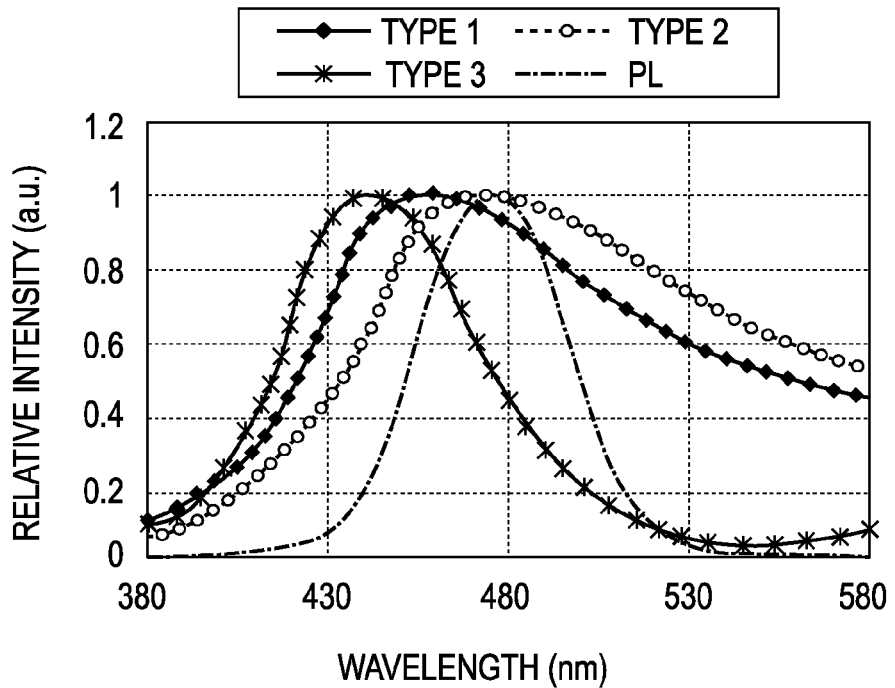
FIG. 5 is a plot showing the interference intensity distribution of the organic light-emitting elements Type 1, Type 2 and Type 3, and the PL spectrum of a light-emitting layer.

FIG. 5 shows the overlap of the interference intensity distributions of the three elements shown in FIG. 3 and the PL spectrum of the light-emitting material. Table 4 and FIG. 5 show that the maximum peak wavelengths $\lambda_1$ of the interference intensity distributions are different from one another, and that overlaps of the interference intensity distributions with the PL spectrum are also different from one another. The element Type 2, which exhibits an interference intensity distribution having a maximum peak wavelength $\lambda_1$ coinciding with the maximum peak wavelength $\lambda_2$ of the PL spectrum, exhibits the highest light extraction efficiency of the three. This is because the overlap of the interference intensity distribution of the element Type 2 with the PL spectrum is largest. However, the element Type 2 has a high CIEy value of chromaticity coordinates and does not necessarily produce favorable blue color. The element Type 3, which exhibits an interference intensity distribution having an maximum peak wavelength $\lambda_1$ having the largest difference from the maximum peak wavelength $\lambda_2$ of the PL spectrum, has a CIEy value of 0.08 and advantageously produces the deepest blue color. However, the overlap of the interference intensity distribution with the PL spectrum is small, and accordingly the light extraction efficiency is lowest of the three. The element Type 1 exhibits intermediate light emitting characteristics between those of Types 2 and 3.

In this instance, a favorable blue color of light extracted from the element refers to a color with CIE chromaticity coordinates of NTSC blue (0.140, 0.080) or their vicinity. The vicinity of the blue CIE chromaticity coordinates of (0.140, 0.080) means that the color of the extracted EL spectrum has chromaticity coordinates within a circle with a center at (0.140, 0.080) and a radius of 0.080. Taking the spectral luminous efficacy into consideration, the higher the CIEy value, the more favorable the blue color.

Table 5 shows the maximum peak wavelengths $\lambda_1$ of the interference intensity distributions of the elements Types 1 to 3, the maximum peak wavelengths $\lambda_2$ of the PL spectrum of the light-emitting material, and the maximum peak wavelengths $\lambda_3$ of the EL spectra extracted from the elements Types 1 to 3 shown in Table 1.

TABLE 5

|  | λ1 | λ2 | λ3 | |λ2 − λ1| | |λ2 − λ3| |
|---|---|---|---|---|---|
| Type 1 | 460 nm | 475 nm | 470 nm | 15 nm | 5 nm |
| Type 2 | 475 nm | 475 nm | 475 nm | 0 nm | 0 nm |
| Type 3 | 440 nm | 475 nm | 460 nm | 35 nm | 15 nm |

As shown in Table 5, the maximum peak wavelengths $\lambda_1$ of the interference intensity distributions of Types 1 and 3 are shifted from the maximum peak wavelengths $\lambda_2$ of the PL spectrum, whereas these two wavelengths coincide with each other in Type 2. The maximum peak wavelengths $\lambda_1$ of the interference intensity distributions of Types 1 and 3 do not coincide with the maximum peak wavelengths $\lambda_3$ of their EL spectra. In Types 1 and 3, the maximum peak wavelength $\lambda_1$ of the interference intensity distribution, the maximum peak wavelength $\lambda_2$ of the PL spectrum and the maximum peak wavelength $\lambda_3$ of the EL spectrum satisfy the relationships: $\lambda_2 \neq \lambda_3$ and $|\lambda_2-\lambda_3|<|\lambda_2-\lambda_1|$. In Type 2, on the other hand, the relationship $|\lambda_2-\lambda_3|=|\lambda_2-\lambda_1|$ holds among the maximum peak wavelengths $\lambda_1$, $\lambda_2$ and $\lambda_3$. In addition, as $|\lambda_2-\lambda_1|$ is increased, that is, as the difference between the maximum peak wavelength $\lambda_1$ of the interference intensity distribution and the maximum peak wavelength $\lambda_2$ of the PL spectrum is increased, the emission color can be controlled effectively.

Types 1 and 3, which satisfy $\lambda_2 \neq \lambda_3$ and $|\lambda_2-\lambda_3|<|\lambda_2-\lambda_1|$, emit favorable color with a lower CIEy value than Type 2.

The organic light-emitting element according to an embodiment of the invention uses the expansion of interference intensity distribution, so that desired color can be extracted even if the color of the PL spectrum considerably differs from the desired color. More specifically, the maximum peak wavelength $\lambda_1$ of the interference intensity distribution is shifted from the maximum peak wavelength $\lambda_2$ of the PL spectrum so as to obtain a desired color from the element, taking into account the expansion of the interference intensity distribution.

The desired color can be selected as appropriate. For example, the desired color may be NTSC red with CIE chromaticity coordinates of (0.670, 0.330), NTSC green with CIE chromaticity coordinates of (0.210, 0.710) or NTSC blue with CIE chromaticity coordinates of (0.140, 0.080). The desired color mentioned herein may have a tolerance. For example, when a color with CIE chromaticity coordinates of ($x_0$, $y_0$) is desired while a color with CIE chromaticity coordinates of (x, y) is emitted, the emission color can be the desired color as long as the deviation $\Delta xy$ (defined by Formula 3) of the CIE chromaticity coordinates (x, y) of the emission color from the CIE chromaticity coordinates ($x_0$, $y_0$) of the desired color is in a specific range.

$$\Delta xy = \{(x-x_0)^2 + (y-y_0)^2\}^{1/2} \qquad \text{Formula 3}$$

It is preferable that the specific range be 0.050 for red, 0.100 for green, and 0.080 for blue. This is because, when emission color with coordinates (x, y) satisfies $\Delta xy \leq 0.050$ for, for example, a desired red color (($x_0$, $y_0$)=(0.670, 0.330)), the color can be perceived as red.

The value specifying a specific range may be different among colors, or may be the same (for example, 0.050). Although the desired color has been specified by a NTSC color with CIE chromaticity coordinates, it may be specified by other coordinate systems.

It is preferable that the half-width of the interference intensity distribution be increased from the viewpoint of extracting emitted light efficiently from the organic light-emitting element to the outside as well as extracting a desired color. Thus the overlap between the interference intensity distribution and the PL spectrum can be increased by shifting the maximum peak wavelengths of the interference intensity distribution and the PL spectrum, even if the color of the PL spectrum is considerably different from a desired color.

An element intended to use strong optical interference is provided at one side of the light-emitting layer 23 with a reflection layer 21a made of, for example, silver or aluminum to increase the reflectance of light, and a translucent layer made of, for example, a thin silver film is provided at the other side. Such an element has a resonator structure therein, and accordingly light can be highly intensified by resonance at a specific wavelength. Consequently, the half-width of the interference intensity distribution is reduced. The resonator structure refers to a structure including a layer or layers and two reflection planes located on both ends of the layer or layers and causing multiple interference of light between the two reflection planes. In the present embodiment, the two reflection planes are defined by the interface between the reflection layer 21a and the transparent electroconductive layer 21b and the interface between the second electrode 26 and the seal space 27, and these interfaces and the organic compound layer between the interfaces form a resonator structure.

Figure 6:
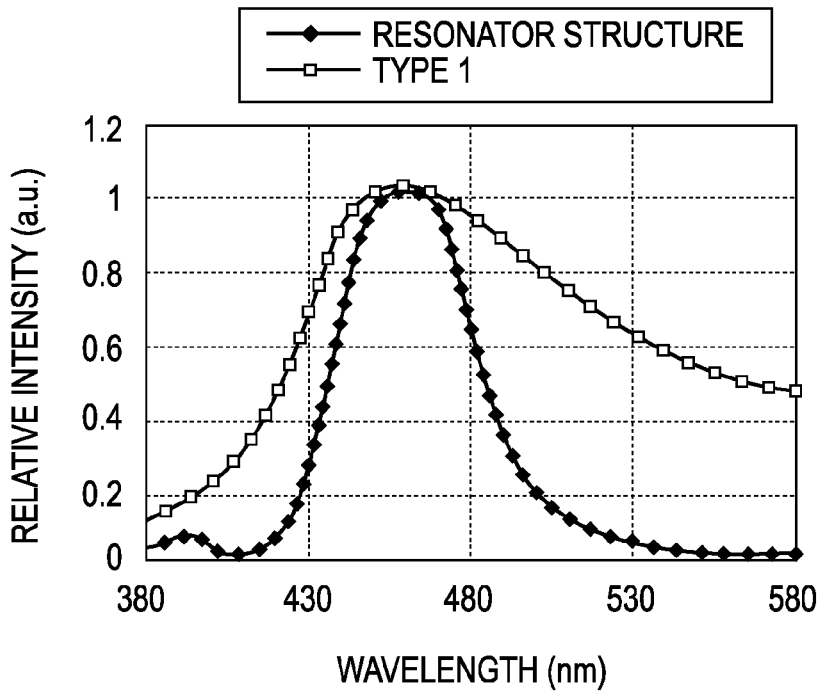
FIG. 6 is a plot showing the interference intensity distributions of an organic light-emitting element including a resonator structure and an organic light-emitting element Type 1.

FIG. 6 shows the interference intensity distribution of an organic light-emitting element having a resonator structure. For comparison, the interference intensity distribution of the element Type 1 is also shown together. The intensity of each element in FIG. 6 is represented by a relative value to the maximum intensity of the corresponding element. Table 6 shows the thicknesses of the layers constituting the organic light-emitting element having a resonator structure. As shown in FIG. 6, the organic light-emitting element having a resonator structure exhibits an interference intensity distribution having a half-width of 46 nm, which is narrower than the half-width of Type 1 of 135 nm.

TABLE 6

| | |
|---|---|
| Reflection layer | 150 nm |
| Transparent electroconductive layer | 10 nm |
| Hole transport layer | 114 nm |
| Light-emitting layer | 35 nm |
| Electron transport layer | 20 nm |
| Electron injection layer | 20 nm |
| Second electrode | 20 nm |

In order to obtain an interference intensity distribution having a comparatively wide half-width, a reflection layer and a transparent layer can be respectively provided at both sides of the light-emitting layer, as described above. For example, in the element Type 1, the ITO second electrode 26 corresponds to the transparent layer. ITO has a refractive index of about 2.0, depending on the forming conditions. Accordingly, the interface between the transparent layer and the external environment (seal space 27) has a reflectance of about 10% due to the difference between their refractive indices. On the other hand, in the element having a resonator structure using a translucent silver thin layer as the second electrode 26 instead of the ITO layer, the reflectance at the interface between the second electrode 26 and the organic compound layers is reduced to about 20% to 50% of the case of using the ITO layer due to the thickness of the translucent layer.

For forming a transparent layer, various materials can be used, such as organic compounds, metals and inorganic materials. The optical interference in the organic light-emitting element of an embodiment of the invention can thus be reduced from that in the organic light-emitting element having a resonator structure. Consequently, a relatively wide interference intensity distribution can be obtained.

Organic light-emitting materials generally used for the light-emitting layer of organic light-emitting elements exhibit PL spectra having half-widths of at least 40 nm. Accordingly, the half-width of the interference intensity distribution can be 40 nm or more for an organic light-emitting element using the overlap between the interference intensity distribution and the PL spectrum by shifting the maximum peak wavelengths ($\lambda_1$, $\lambda_2$) of the interference intensity distribution and the PL spectrum, as in the organic light-emitting element of an embodiment of the invention. Preferably, the half-width A of the interference intensity distribution is larger than the half-width B of the PL spectrum.

However, as the half-width of the interference intensity distribution is increased, the intensity of the interference intensity distribution is reduced over the entire range of wavelengths. It is therefore preferable that the half-width be limited to 200 nm or less from the viewpoint of ensuring a sufficient luminous efficiency.

In addition, it is advantageous that the half-width A of the interference intensity distribution satisfies the relationship expressed by Formula 4 with the difference ($|\lambda_2-\lambda_1|$) between the maximum peak wavelengths of the PL spectrum and the interference intensity distribution.

$$A/2 \geq (|\lambda_2 - \lambda_1|) \qquad \text{Formula 4}$$

Thus, a sufficient overlap can be ensured between the PL spectrum of the light-emitting material and the interference intensity distribution, and, accordingly, an organic light-emitting element having high luminous efficiency can be achieved. Even if the color of the PL spectrum is considerably different from a desired color, an element having an interference intensity distribution satisfying Formula 4 can produce the desired color, and in addition, can exhibit a high luminous efficiency. Thus, the light-emitting material can be selected in terms of a viewpoint other than emission color, such as lifetime. Accordingly, the light-emitting material can be selected from a wide range of choices. In addition, it is advantageous that the half-width A of the interference intensity distribution satisfies the relationship expressed by Formula 5 with the half-width B of the PL spectrum and the difference ($|\lambda_2-\lambda_1|$) between the maximum peak wavelengths of the PL spectrum and the interference intensity distribution.

$$A/2 \geq B/2+|\lambda_2-\lambda_1| \qquad \text{Formula 5}$$

In view of constructive optical interference, as the order is lower with the same resonant wavelength, the interference effect is enhanced. Accordingly, constructive optical interference can be used effectively by setting the order as low as possible.

In addition, it is desirable that the peak wavelength $\lambda_1$ of the interference intensity distribution coincides with a wavelength at which the PL spectrum has an intensity of 50% or more of the maximum intensity (intensity at a wavelength $\lambda_2$). Thus, a sufficient overlap can be ensured between the PL spectrum and the interference intensity distribution, and, accordingly, an organic light-emitting element having high luminous efficiency can be achieved. Furthermore, it is desirable that the peak wavelength $\lambda_1$ of the interference intensity distribution coincides with a wavelength at which the PL spectrum has an intensity of 60% to 95%, preferably 75% to 90%, of the maximum intensity. Such an organic light-emitting element can exhibit high luminous efficiency.

Although the first electrode 21 acts as an anode and the second electrode 26 acts a cathode in the present embodiment, the first electrode 21 may act as a cathode and the second electrode 26 may act as an anode.

Although the light-emitting element of the present embodiment is of top emission type, the structure of the element is not particularly limited to top emission type and may have a bottom emission structure including a second electrode, at least one organic compound layer and a first electrode in that order on a transparent substrate.

Figure 7:
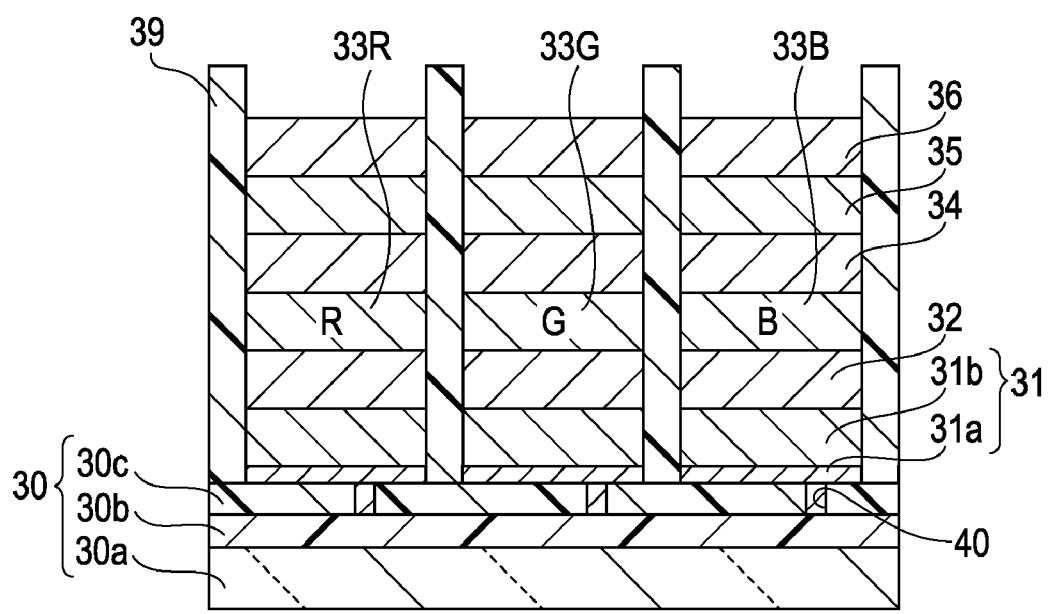
FIG. 7 is a schematic sectional view of a display device prepared in Example 4 of the present invention.

A second embodiment of the present invention will now be described. FIG. 7 shows a light-emitting device according to an embodiment of the present invention. The light-emitting device includes a plurality of pixels, each including an organic light-emitting element, and a drive circuit controlling the light emission from the pixels. At least one of the pixels includes the organic light-emitting element according to an embodiment of the invention.

The light-emitting device can be used as a display device. In this display device, a plurality of pixel units are arranged in a matrix, and each pixel unit includes a plurality of pixels emitting light having different colors. For example, the pixel unit may include a red light-emitting pixel, a green light-emitting pixel and a blue light-emitting pixel.

The pixel mentioned herein refers to a minimum unit whose light emission can independently be controlled. The pixel unit mentioned herein refers to a minimum unit including a plurality of pixels emitting different colors and capable of emitting light having a desired color by mixing the colors of the pixels.

In the present embodiment, all the pixels may use the organic light-emitting element of an embodiment of the invention, or one or some of the pixels may use the organic light-emitting element of an embodiment of the invention. In other words, the display device may include both the organic light-emitting element of an embodiment of the invention and a known type of organic light-emitting element. In this instance, the light emitting characteristics of the resulting display device can be controlled by adjusting the proportion of both types.

If both types are used, the organic light-emitting elements of an embodiment of the invention and known organic light-emitting elements may be arranged regularly, or the arrangement may be irregularly dotted with the organic light-emitting elements of an embodiment of the invention.

The light-emitting device of the present embodiment can be used for a variety of applications, such as illumination, printer heads, backlights of exposure apparatuses and display devices. If the light-emitting device is used as a display device, examples of the display device include a TV set, the display of a personal computer, the back display of an image pickup apparatus, the display of a cellar phone, and the display of a portable game machine. Furthermore, the display device can serve as the display of a portable music player, the display of a personal digital assistant (PDA), or the display of a car navigation system.

EXAMPLES

Examples according to aspects of the present invention will now be described in detail with reference to some drawings. However, the invention is not limited to the examples below.

Example 1

An organic light-emitting element shown in FIG. 2 was prepared in the following process.

Aluminum alloy (AlNd) was deposited to a thickness of 150 nm on a substrate 20 by sputtering to form a reflection layer 21a, and ITO was deposited to a thickness of 10 nm on the reflection layer 21a by sputtering to form a transparent electroconductive layer 21b. The resulting substrate was subjected to ultrasonic cleaning with isopropyl alcohol (IPA) and boiling cleaning, followed by drying. After UV/ozone cleaning, organic compounds were deposited by vacuum vapor deposition as below.

First, a compound expressed by Chemical Formula 1 was deposited to a thickness of 30 nm to form a hole transport layer 22 at a vacuum of $1\times10^{-4}$ Pa and a deposition rate of 0.2 nm/s.

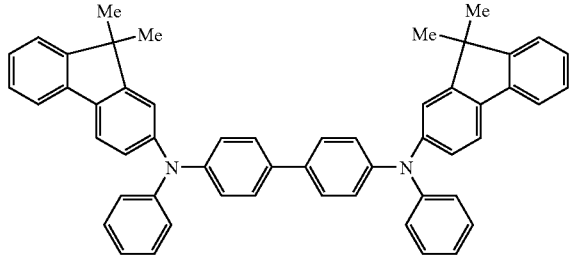

Chemical Formula 1

Figure 4:
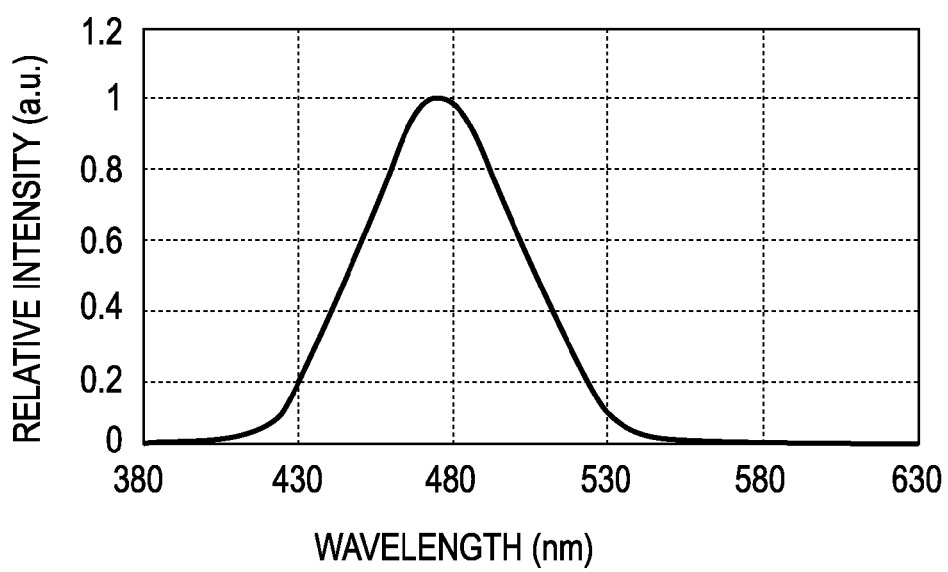
FIG. 4 is the PL spectrum of a light-emitting layer.

Then, a blue light-emitting layer 23 exhibiting the PL spectrum shown in FIG. 4 was formed to a thickness of 35 nm by vacuum vapor deposition at a vacuum of $1\times10^{-4}$ Pa and a deposition rate of 0.2 nm/s.

Subsequently, bathophenanthroline (Bphen) was deposited to a thickness of 10 nm by vacuum vapor deposition to form an electron transport layer 24 at a vacuum of $1\times10^{-4}$ Pa and a deposition rate of 0.2 nm/s.

Furthermore, an electron injection layer 25 was formed to a thickness of 65 nm by codeposition of Bphen and $Cs_2CO_3$ (weight ratio of 90:10) at a vacuum of $3\times10^{-4}$ Pa and a deposition rate of 0.2 nm/s.

Then, the substrate having the layers up to the electron injection layer 25 was transferred into a sputtering apparatus without breaking vacuum, and ITO was deposited to a thickness of 20 nm to form a second electrode 26.

The resulting substrate was placed in a glove box filled with dry nitrogen, and a UV-curable resin was applied onto an outer region of the substrate by a seal dispenser. Then, the substrate was covered with a 0.7 mm thick U-shaped glass plate (sealing member 28) having a recess of 0.3 mm in depth in the portion corresponding to the layers of the organic light-emitting element. Then, the UV-curable resin on the substrate was cured by UV irradiation so that the glass plate adheres to the substrate. Thus, an organic light-emitting element was completed.

The light emitting characteristics of the resulting organic light-emitting element were examined by applying a current between the first electrode 21 including the reflection layer 21a and the transparent electroconductive layer 21b and acting as an anode and the second electrode 26 acting as a cathode. Table 7 shows the characteristics of the element: luminous efficiency; CIE chromaticity coordinates; maximum peak wavelengths ($\lambda_1$, $\lambda_2$, and $\lambda_3$) of the interference intensity distribution, PL spectrum and EL spectrum; $|\lambda_2-\lambda_1|$ and $|\lambda_2-\lambda_3|$; and half-widths of the interference intensity distribution and PL spectrum.

TABLE 7

| Luminous efficiency (cd/A) | | 4.6 |
|---|---|---|
| Chromaticity coordinates | CIEx | 0.111 |
| | CIEy | 0.135 |
| Maximum peak wavelength | Interference intensity distribution $\lambda_1$ | 458 nm |
| | PL spectrum $\lambda_2$ | 474 nm |
| | EL spectrum $\lambda_3$ | 468 nm |
| Difference in peak wavelength | $|\lambda_2 - \lambda_1|$ | 16 nm |
| | $|\lambda_2 - \lambda_3|$ | 6 nm |
| Half-width | Interference intensity distribution | 135 nm |
| | PL spectrum | 46 nm |

As shown in Table 7, the organic light-emitting element of Example 1 exhibited superior light emitting characteristics. The respective maximum peak wavelengths ($\lambda_1$, $\lambda_2$, $\lambda_3$) of the interference intensity distribution, the PL spectrum and the EL spectrum satisfied the relationships: $\lambda_2 \neq \lambda_3$ and $|\lambda_2-\lambda_3|<|\lambda_2-\lambda_1|$. The half-width A of the interference intensity distribution satisfies the relationship: A/2 (=67.5 nm)>$|\lambda_2-\lambda_1|$ (=16 nm). The relationship with the half-width B of the PL spectrum is expressed by A/2 (=67.5 nm)>B/2+$|\lambda_2-\lambda_1|$ (=23 nm+16 nm). The color of the EL spectrum extracted from the element had CIE chromaticity coordinates of (0.111, 0.135), and the deviation Δxy from the blue CIE chromaticity coordinates (0.140, 0.080) was 0.063, lower than 0.080.

Example 2

The organic light-emitting element of Example 2 is different from that of Example 1 in that the transparent electroconductive layer 21b and the hole transport layer 22 were formed to thicknesses of 100 nm and 52 nm, respectively. The other layers have the same thicknesses as in Example 1. Table 8 shows the light emitting characteristics of the organic light-emitting element of Example 2.

TABLE 8

| Luminous efficiency (cd/A) | | 2.1 |
|---|---|---|
| Chromaticity coordinates | CIEx | 0.125 |
| | CIEy | 0.080 |
| Maximum peak wavelength | Interference intensity distribution $\lambda_1$ | 440 nm |
| | PL spectrum $\lambda_2$ | 475 nm |
| | EL spectrum $\lambda_3$ | 460 nm |
| Difference in peak wavelength | $|\lambda_2 - \lambda_1|$ | 35 nm |
| | $|\lambda_2 - \lambda_3|$ | 15 nm |
| Half-width | Interference intensity distribution | 65 nm |
| | PL spectrum | 46 nm |

As shown in Table 8, the organic light-emitting element of Example 2 emitted a deepest blue color with CIEy of 0.08 of the luminescent chromaticity. The color of the EL spectrum extracted from the element had CIE chromaticity coordinates of (0.125, 0.080), and the deviation Δxy from the blue CIE chromaticity coordinates (0.140, 0.080) was 0.015, lower than 0.080.

The respective maximum peak wavelengths ($\lambda_1$, $\lambda_2$, $\lambda_3$) of the interference intensity distribution, the PL spectrum and the EL spectrum satisfied the relationships: $\lambda_2 \neq \lambda_3$ and $|\lambda_2-\lambda_3|<|\lambda_2-\lambda_1|$.

In the present example, the maximum peak wavelengths ($\lambda_1$ and $\lambda_2$) of the interference intensity distribution and the PL spectrum had a larger difference than those in Example 1. Consequently, the emission color can be highly controlled, and thus the organic light-emitting element of Example 2 can emit favorable color.

Example 3

The organic light-emitting element of Example 3 is different from that of Example 1 in that the reflection layer 21a was formed of a silver alloy (AgPdCu) to a thickness of 150 nm, and that the hole transport layer 22 and the electron injection layer 25 were formed to thicknesses of 124 nm and 20 nm respectively. In addition, the second electrode 26 was formed of silver, instead of ITO, to a thickness of 20 nm in a sputtering apparatus. The other layers of the element were formed of the same materials to the same thicknesses as in Example 1. Table 9 shows the light emitting characteristics of the resulting organic light-emitting element of Example 3.

TABLE 9

| Luminous efficiency (cd/A) | | 3.2 |
|---|---|---|
| Chromaticity coordinates | CIEx | 0.108 |
| | CIEy | 0.116 |
| Maximum peak wavelength | Interference intensity distribution $\lambda_1$ | 460 nm |
| | PL spectrum $\lambda_2$ | 476 nm |
| | EL spectrum $\lambda_3$ | 468 nm |
| Difference in peak wavelength | $|\lambda_2 - \lambda_1|$ | 16 nm |
| | $|\lambda_2 - \lambda_3|$ | 8 nm |
| Half-width | Interference intensity distribution | 46 nm |
| | PL spectrum | 46 nm |

As shown in Table 9, the organic light-emitting element of Example 3 exhibited substantially the same luminescent chromaticity as that of Example 1. The color of the EL spectrum extracted from the element had CIE chromaticity coordinates of (0.108, 0.116), and the deviation Δxy from the blue CIE chromaticity coordinates (0.140, 0.080) was 0.048, lower than 0.080.

The half-width A of the interference intensity distribution was the same as the half-width B of the PL spectrum.

The reason why the maximum peak wavelengths of the PL spectra were different among Examples 1 to 3 is simply deviation among measurements, and the same light-emitting material was used.

Comparative Example 1

For an organic light-emitting element of Comparative Example 1, the hole transport layer 22 was formed to a thickness of 40 nm. The other layers were formed to the same thicknesses as in Example 1. Table 10 shows the light emitting characteristics of the resulting organic light-emitting element of Comparative Example 1.

TABLE 10

| Luminous efficiency (cd/A) | | 4.8 |
|---|---|---|
| Chromaticity coordinates | CIEx | 0.104 |
| | CIEy | 0.165 |
| Maximum peak wavelength | Interference intensity distribution $\lambda_1$ | 475 nm |
| | PL spectrum $\lambda_2$ | 475 nm |
| | EL spectrum $\lambda_3$ | 475 nm |
| Difference in peak wavelength | $\|\lambda_2 - \lambda_1\|$ | 0 nm |
| | $\|\lambda_2 - \lambda_3\|$ | 0 nm |
| Half-width | Interference intensity distribution | 160 nm |
| | PL spectrum | 46 nm |

As shown in Table 10, the organic light-emitting element of Comparative Example 1 emitted pale color with a higher CIEy than the element of Example 1. The color of the EL spectrum extracted from the element had CIE chromaticity coordinates of (0.104, 0.165), and the deviation Δxy from the blue CIE chromaticity coordinates (0.140, 0.080) was 0.092, higher than 0.080.

The luminous efficiency was higher than that of Example 1. This is because the color of emitted from the element was changed to increase the visual efficiency. The practical luminous efficiency at a time when a desired blue color was emitted was reduced from that of Example 1.

Hence, the light emitting characteristics of the element of Example 1 are superior to those of Comparative Example 1 as a whole.

The respective maximum peak wavelengths ($\lambda_1$, $\lambda_2$, $\lambda_3$) of the interference intensity distribution, the PL spectrum and the EL spectrum had the relationships: $|\lambda_2-\lambda_3|=|\lambda_2-\lambda_1|$.

Example 4

In Example 4, a light-emitting device according to an embodiment of the invention was used as a display device. The display device of Example 4 includes a plurality of pixels using organic light-emitting elements emitting red, green and blue colors. As with the organic light-emitting element of Example 1, each of the organic light-emitting elements exhibits an interference intensity distribution, a PL spectrum and an EL spectrum having maximum peaks respectively at wavelengths $\lambda_{1,2}$ and $\lambda_3$ satisfying the relationships: $\lambda_2 \neq \lambda_3$ and $|\lambda_2-\lambda_3|<|\lambda_2-\lambda_1|$. In addition, the half-width A of the interference intensity distribution of each element is set so as to be larger than the value obtained by adding $|\lambda_2-\lambda_1|$ to the half-width B of the PL spectrum of the light-emitting material in the light-emitting layer of the element. Hence, Formula 5 holds.

FIG. 7 is a schematic sectional view of the display device of the present example. The display device was prepared by the following process.

A substrate 30 was prepared by forming a low-temperature polysilicon drive circuit 30b on a glass support 30a and then forming a planarizing layer 30c of an acrylic resin on the driving circuit 30b. A reflection layer 31a was formed on the planarizing layer 30c by depositing an aluminum alloy (AlNd) to a thickness of 150 nm by sputtering, followed by patterning.

Subsequently, a transparent electroconductive layer 31b was formed by depositing ITO to a thickness of 100 nm by sputtering, followed by patterning for the respective pixels. Thus, a first electrode 31 including the AlNd layer and the ITO layer was formed. Reference numeral 40 designates a contact hole electrically connecting the driving circuit 30b to the first electrode 31, and is formed by pattering the planarizing layer 30c before forming the first electrode 31.

Partitions 39 were further formed of an acrylic resin. The resulting substrate was subjected to ultrasonic cleaning with IPA and boiling cleaning, followed by drying. After UV/ozone cleaning, organic compounds were deposited by vacuum vapor deposition as below.

First, a common hole transport layer 32 was formed of the compound expressed by Chemical Formula 1 for all pixels in the same manner as in Example 1 at a vacuum of $1 \times 10^{-4}$ Pa and a deposition rate of 0.2 nm/s.

Then, red, green and blue light-emitting layers 33R, 33G and 33B were formed to the respected pixels through a shadow mask. The light-emitting material for the red light-emitting layer 33R provides a PL spectrum having a maximum peak at a wavelength of 620 nm and a half-width of 97 nm. The light-emitting material for the green light-emitting layer 33G provides a PL spectrum having a maximum peak at a wavelength of 525 nm and a half-width of 68 nm. The light-emitting material for the blue light-emitting layer 33B provides a PL spectrum having a maximum peak at a wavelength of 460 nm and a half-width of 45 nm.

Subsequently, a common electron transport layer 34 was formed by vacuum vapor deposition of bathophenanthroline (Bphen) at a vacuum of $1 \times 10^{-4}$ Pa and a deposition rate of 0.2 nm/s.

Furthermore, a common electron injection layer 35 was formed by codeposition of Bphen and $Cs_2CO_3$ (weight ratio of 90:10) at a vacuum of $3 \times 10^{-4}$ Pa and a deposition rate of 0.2 nm/s.

Then, the substrate having the layers up to the electron injection layer 35 was transferred into a sputtering apparatus without breaking vacuum, and ITO was deposited to form a second electrode 36 at a vacuum of $1 \times 10^{-4}$ Pa and a deposition rate of 0.2 nm/s.

The resulting substrate was placed in a glove box filled with dry nitrogen, and a UV-curable resin was applied onto an outer region of the substrate by a seal dispenser. Then, the substrate was covered with a 0.7 mm thick U-shaped glass plate (sealing member 28) having a recess of 0.3 mm in depth in the portion corresponding to the layers of the organic light-emitting element. Then, the UV-curable resin on the substrate was cured by UV irradiation so that the glass plate adheres to the substrate. Thus, a display device was completed. The UV curable resin and the glass plate are not shown in FIG. 7.

Table 11 shows the thicknesses of the reflection layer 31a, the transparent electroconductive layer 31b, the organic compound layers and the second electrode for the pixel of each color in the display device.

TABLE 11

|  | Red pixel | Green pixel | Blue pixel |
|---|---|---|---|
| Reflection layer | | 150 nm | |
| Transparent electroconductive layer | | 100 nm | |
| Hole transport layer | 162 nm | 96 nm | 44 nm |
| Light-emitting layer | 25 nm | 37 nm | 35 nm |
| Electron transport layer | | 20 nm | |
| Electron injection layer | | 65 nm | |
| Second electrode | | 31 nm | |

Table 12 shows the characteristics of the resulting display device: maximum peak wavelengths ($\lambda_1$, $\lambda_2$, $\lambda_3$) of the interference intensity distribution, PL spectrum and EL spectrum; differences in peak wavelength ($|\lambda_2-\lambda_1|$, $|\lambda_2-\lambda_3|$); and half-widths of the interference intensity distribution and PL spectrum.

TABLE 12

|  |  | Red pixel | Green pixel | Blue pixel |
|---|---|---|---|---|
| Maximum peak wavelength | Interference intensity distribution $\lambda_1$ | 590 nm | 500 nm | 440 nm |
| | PL spectrum $\lambda_2$ | 620 nm | 525 nm | 460 nm |
| | EL spectrum $\lambda_3$ | 615 nm | 520 nm | 455 nm |
| Difference in peak wavelength | $|\lambda_2 - \lambda_1|$ | 30 nm | 25 nm | 20 nm |
| | $|\lambda_2 - \lambda_3|$ | 5 nm | 5 nm | 5 nm |
| Half-width | Interference intensity distribution | 138 nm | 93 nm | 71 nm |
| | PL spectrum | 97 nm | 68 nm | 46 nm |

Comparative Example 2

In the display device of Comparative Example 2, the maximum peak wavelength $\lambda_1$ of the interference intensity distribution and the maximum peak wavelength $\lambda_2$ of the PL spectrum of the organic light-emitting element were the same in each pixel. Consequently, $\lambda_3$ coincided with $\lambda_1$ and $\lambda_2$. In order words, the maximum peak wavelengths $\lambda_1$, $\lambda_2$ and $\lambda_3$ of the interference intensity distribution, PL spectrum and EL spectrum were set so as to have the relationship $|\lambda_2-\lambda_3|=|\lambda_2-\lambda_1|$.

The thicknesses of the layers in each pixel are shown in Table 13. The others of the display device were formed in the same manner as in Example 4.

TABLE 13

|  | Red pixel | Green pixel | Blue pixel |
|---|---|---|---|
| Reflection layer | | 150 nm | |
| Transparent electroconductive layer | | 100 nm | |
| Hole transport layer | 183 nm | 103 nm | 61 nm |
| Light-emitting layer | 25 nm | 37 nm | 35 nm |
| Electron transport layer | | 20 nm | |
| Electron injection layer | | 57 nm | |
| Second electrode | | 42 nm | |

Table 14 shows the characteristics of the resulting display device: maximum peak wavelengths ($\lambda_1$, $\lambda_2$, $\lambda_3$) of the interference intensity distribution, PL spectrum and EL spectrum; differences in peak wavelength ($|\lambda_2-\lambda_1|$, $|\lambda_2-\lambda_3|$); and half-widths of the interference intensity distribution and PL spectrum.

TABLE 14

|  |  | Red pixel | Green pixel | Blue pixel |
|---|---|---|---|---|
| Maximum peak wavelength | Interference intensity distribution $\lambda_1$ | 620 nm | 525 nm | 460 nm |
| | PL spectrum $\lambda_2$ | 620 nm | 525 nm | 460 nm |
| | EL spectrum $\lambda_3$ | 620 nm | 525 nm | 460 nm |
| Difference in peak wavelength | $|\lambda_2 - \lambda_1|$ | 0 nm | 0 nm | 0 nm |
| | $|\lambda_2 - \lambda_3|$ | 0 nm | 0 nm | 0 nm |
| Half-width | Interference intensity distribution | 153 nm | 92 nm | 68 nm |
| | PL spectrum | 97 nm | 68 nm | 46 nm |

The power consumption and the color reproduction range of the display devices of Example 4 and Comparative Example 2 were compared with each other. The results are shown in the Table 15. The power consumptions are represented by relative values to the power consumption of the display device of Example 4. The ranges of color reproduction are represented by percentage relative to the CIE chromaticity coordinates of the NTSC colors.

TABLE 15

|  | Example 4 | Comparative Example 2 |
|---|---|---|
| Power consumption | 1.00 | 1.02 |
| Range of color reproduction | 93% | 80% |

As shown in Table 15, the display device of Example 4 according to aspects of the present invention exhibited substantially the same power consumption as the display device of Comparative Example 2, and can achieve color reproduction in a wider range than the display device of Comparative Example 2.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2008-324479 filed Dec. 19, 2008, which is hereby incorporated by reference herein in its entirety.

What is claimed is:

1. An organic light-emitting element comprising:
a first electrode;
a second electrode; and
at least one organic compound layer disposed between the first electrode and the second electrode, the organic compound layer including a light-emitting layer containing a light-emitting material and being configured to emit light toward the first electrode and the second electrode,
wherein light emitted from the light-emitting layer is intensified by interference of light in the organic light-emitting element,
wherein the interference provides an interference intensity distribution having a maximum peak at a wavelength $\lambda_1$, the light-emitting material of the light-emitting layer exhibits a photoluminescence spectrum having a maximum peak at a wavelength $\lambda_2$, the organic light-emitting element produces an electroluminescence spectrum having a maximum peak at a wavelength $\lambda_3$, and the wavelengths satisfy the relationships: $\lambda_2 \neq \lambda_3$ and $|\lambda_2-\lambda_3|<|\lambda_2-\lambda_1|$, and wherein chromaticity coordinates of an emission color of the organic light-emitting element are included within a circle with a center at (0.140, 0.080) and a radius of 0.080 in NTSC chromaticity coordinates.

2. The organic light-emitting element according to claim 1, wherein the interference intensity distribution and the photoluminescence spectrum satisfy the relationship: $A/2 \geq |\lambda_2-\lambda_1|$, wherein A represents the half-width of the interference intensity distribution.

3. The organic light-emitting element according to claim 1, wherein the interference intensity distribution and the photoluminescence spectrum satisfy the relationship: $A/2 \geq B/2 + |\lambda_2-\lambda_1|$, wherein A represents the half-width of the interference intensity distribution and B represents the half-width of the photoluminescence spectrum.

4. The organic light-emitting element according to claim 1, wherein the half-width A of the interference intensity distribution is in the range of 40 to 200 nm.

5. A light-emitting device comprising:
a plurality of pixels, each including an organic light-emitting element; and
a drive circuit controlling the light emission from the pixels,
wherein the plurality of pixels include a red light-emitting pixel, a green light-emitting pixel and a blue light-emitting pixel, and
wherein the blue light-emitting pixel includes the organic light-emitting element as set forth in claim 1.

6. An organic light-emitting element comprising:
a first electrode;
a second electrode; and
at least one organic compound layer disposed between the first electrode and the second electrode, the organic compound layer including a light-emitting layer containing a light-emitting material and being configured to emit light toward the first electrode and the second electrode,
wherein light emitted from the light-emitting layer is intensified by interference of light in the organic light-emitting element, and
wherein a layer thickness between a reflection plane located at the first electrode and the second electrode is set or a material of at least one of the first electrode, the organic compound layer and the second electrode is selected, so as to satisfy the relationships:

$\lambda_2 \neq \lambda_3$ and $|\lambda_2-\lambda_3|<|\lambda_2-\lambda_1|$, where $\lambda_1$ is a maximum peak of an interference intensity distribution, $\lambda_2$ is a maximum peak of a photoluminescence spectrum of the light-emitting material of the light-emitting layer, and $\lambda_3$ is a maximum peak of an electroluminescence spectrum of the organic light-emitting element, and such that chromaticity coordinates of an emission color of the organic light-emitting element are included within a circle with a center at (0.140, 0.080) and a radius of 0.080 in NTSC chromaticity coordinates.

7. The organic light-emitting element according to claim 6, wherein the layer thickness between the reflection plane located at the first electrode and the second electrode is set or a material of at least one of the first electrode, the organic compound layer and the second electrode is selected, so as to satisfy the relationship:

$A/2 \geq |\lambda_2-\lambda_1|$, where A represents the half-width of the interference intensity distribution.

8. The organic light-emitting element according to claim 6, wherein the layer thickness between the reflection plane located at the first electrode and the second electrode is set or a material of at least one of the first electrode, the organic compound layer and the second electrode is selected, so as to satisfy the relationship:

$A/2 \geq B/2 + |\lambda_2-\lambda_1|$, where A represents the half-width of the interference intensity distribution and B represents the half-width of the photoluminescence spectrum.

9. The organic light-emitting element according to claim 6, wherein the layer thickness between the reflection plane located at the first electrode and the second electrode is set or a material of at least one of the first electrode, the organic compound layer and the second electrode is selected, such that the half-width A of the interference intensity distribution is in the range of 40 to 200 nm.

10. A light-emitting device comprising:
a plurality of pixels, each including an organic light-emitting element; and
a drive circuit controlling the light emission from the pixels,
wherein the plurality of pixels include a red light-emitting pixel, a green light-emitting pixel and a blue light-emitting pixel, and
wherein the blue light-emitting pixel includes the organic light-emitting element as set forth in claim 6.

11. The organic light-emitting element according to claim 1, wherein the interference provides an interference intensity distribution having a maximum peak at a wavelength $\lambda_1$, the light-emitting material of the light-emitting layer exhibits a photoluminescence spectrum having a maximum peak at a wavelength $\lambda_2$, the organic light-emitting element produces an electroluminescence spectrum having a maximum peak at a wavelength $\lambda_3$, and the wavelengths satisfy the relationship: $\lambda_1 < \lambda_3 < \lambda_2$.

12. The organic light-emitting device according to claim 5, wherein each of the red-light emitting pixel and the green light-emitting pixel comprises a first electrode having a reflection plane, an organic compound layer having a light-emitting layer and a second electrode,
wherein each of the red-light emitting pixel and the green light-emitting pixel includes an organic light-emitting element configured to cause light emitted from the light-emitting layer between the reflection plane of the first electrode and the second electrode to interfere with each other and to intensify the emitted light by the interference, and
wherein each of the organic light-emitting element included in the red light-emitting pixel and the green light-emitting pixel satisfies the relationships:

$\lambda_2 \neq \lambda_3$ and $|\lambda_2=\lambda_3|<|\lambda_2-\lambda_1|$ where $\lambda_1$, is a maximum peak of an interference intensity distribution, $\lambda_2$ is a maximum peak of a photoluminescence spectrum of the light-emitting material of each of the light-emitting layers, and $\lambda_3$ is a maximum peak of an electroluminescence spectrum of each of the organic light-emitting elements.

13. The organic light-emitting device according to claim 12, wherein chromaticity coordinates of an emission color of the organic light-emitting element included in the red light-emitting pixel are included within a circle with a center at (0.670, 0.330) and a radius of 0.050 in NTSC chromaticity coordinates, and wherein chromaticity coordinates of an emission color of the organic light-emitting element included in the green light-emitting pixel are included within a circle with a center at (0.210, 0.710) and a radius of 0.100 in NTSC chromaticity coordinates.

14. The organic light-emitting element according to claim 6, wherein the layer thickness between the reflection plane located at the first electrode and the second electrode is set or a material of at least one of the first electrode, the organic compound layer and the second electrode is selected, so as to satisfy the relationship:

$$\lambda_1 < \lambda_3 < \lambda_2,$$

where $\lambda_1$, is a maximum peak of an interference intensity distribution, $\lambda_2$ is a maximum peak of a photoluminescence spectrum of the light-emitting material of the light-emitting layer, and $\lambda_3$ is a maximum peak of an electroluminescence spectrum of the organic light-emitting element.

15. The organic light-emitting device according to claim 10, wherein each of the red-light emitting pixel and the green light-emitting pixel comprises a first electrode having a reflection plane, an organic compound layer having a light-emitting layer and a second electrode, wherein each of the red-light emitting pixel and the green light-emitting pixel includes an organic light-emitting element configured to cause light emitted from the light-emitting layer between the reflection plane of the first electrode and the second electrode to interfere with each other and to intensify the emitted light by the interference, and wherein a layer thickness between the reflection plane located at the first electrode and the second electrode is set or a material of at least one of the first electrode, the organic compound layer and the second electrode is selected, such that each of the organic light-emitting elements included in the red light-emitting pixel and the green light-emitting pixel satisfies the relationships:

$$\lambda_2 \neq \lambda_3 \text{ and } |\lambda_2 - \lambda_3| < |\lambda_2 - \lambda_1|,$$

where $\lambda_1$ is a maximum peak of an interference intensity distribution, $\lambda_2$ is a maximum peak of a photoluminescence spectrum of the light-emitting material of each of the light-emitting layers, and $\lambda_3$ is a maximum peak of an electroluminescence spectrum of each of the organic light-emitting elements.

16. The organic light-emitting device according to claim 15, wherein, in the organic light-emitting element included in the red light-emitting pixel, the layer thickness between the reflection plane located at the first electrode and the second electrode is set or a material of at least one of the first electrode, the organic compound layer and the second electrode is selected, such that chromaticity coordinates of an emission color of the organic light-emitting element are included within a circle with a center at (0.670, 0.330) and a radius of 0.050 in NTSC chromaticity coordinates, and wherein, in the organic light-emitting element included in the green light-emitting pixel, the layer thickness between the reflection plane located at the first electrode and the second electrode is set or a material of at least one of the first electrode, the organic compound layer and the second electrode is selected, such that chromaticity coordinates of an emission color of the organic light-emitting element are included within a circle with a center at (0.210, 0.710) and a radius of 0.100 in NTSC chromaticity coordinates.

* * * * *